United States Patent [19]

Tojima et al.

[11] Patent Number: 5,368,780
[45] Date of Patent: Nov. 29, 1994

[54] HEAT RESISTANT HERAPATHITE AND PROCESS FOR PRODUCING THE SAME

[75] Inventors: Kazuo Tojima; Shinobu Okayama; Arimitsu Usuki; Narihito Tatsuda; Kazuhisa Yano; Hisato Takeuchi, all of Aichi, Japan

[73] Assignees: Toyota Jidosha Kabushiki Kaisha; Kabushiki Kaisha Toyota Chuo Kenkyusho, Aichi, Japan

[21] Appl. No.: 791,718

[22] Filed: Nov. 14, 1991

[30] Foreign Application Priority Data

Nov. 16, 1990 [JP] Japan ............................ 2-312355
Aug. 26, 1991 [JP] Japan ............................ 3-213839

[51] Int. Cl.$^5$ .......................... F21V 9/00; F21V 9/14; G02F 1/00
[52] U.S. Cl. ................................ 252/582; 252/585; 359/296; 546/134
[58] Field of Search ............... 252/582, 585; 546/135, 546/134; 359/296; 423/467

[56] References Cited

U.S. PATENT DOCUMENTS

| | | | |
|---|---|---|---|
| 3,625,869 | 12/1971 | Marks | 252/585 |
| 3,655,267 | 4/1972 | Forlini | 252/585 |
| 3,709,828 | 1/1973 | Marks | 252/585 |
| 3,900,417 | 8/1975 | Marks | 252/585 |
| 4,273,422 | 6/1981 | Saxe | 359/296 |
| 4,407,565 | 10/1983 | Saxe | 359/296 |
| 4,442,019 | 4/1984 | Marks | 359/296 |
| 5,130,057 | 7/1992 | Saxe | 252/585 |

FOREIGN PATENT DOCUMENTS 48-20560 6/1973 Japan .
62-40389 8/1987 Japan .

OTHER PUBLICATIONS

Kolloid–Zeitschrift, vol. XLV, Aug. 1928, Dresden, Germany, pp. 195–197; E. Hatschek: "Erine Heraphit–Suspension".

Primary Examiner—Philip Tucker

[57] ABSTRACT

A herapathite has a capillary crystal form in which its iodine atoms are oriented in a major axis direction of the capillary crystal form. The herapathite obtained is expressed by a chemical formula, $xC_{20}H_{24}N_2O_2 \cdot yH_2SO_4 \cdot zHI_3$, in which a ratio of a number of the sulfuric acid molecules (y) with respect to a number of the iodine atoms (3z), i.e., (y/3z), is less than 0.5. The production process includes a reaction step, a first separating step, a recrystallizing step and a second separating step. A solvent used in the recrystallizing step is at least one of water and alcohol. A mixing weight ratio of water with respect to alcohol of the solvent is more than 50/50 or less than 10/90. The herapathite does not degrade even after it is heated up to 130° C., and it is applicable to an automobile light shielding glass which should show a high transparency when a voltage is applied thereto.

15 Claims, 12 Drawing Sheets

ORIENTATION DIRECTION
OF IODINE ATOMS
IN A HERAPATHITE CRYSTAL

PRIOR ART

PRESENT INVENTION

ORIENTATION
DIRECTION
OF IODINE ATOMS
IN A STRUCTURAL
UNIT OF HERAPATHITE

HEAT RESISTANT HERAPATHITE AND PROCESS FOR PRODUCING THE SAME

BACKGROUND OF THE INVENTION

1. Field of the Invention

The present invention relates to a herapathite which is utilized in a light controlling device such as an optical valve or the like, and to a process for producing the same.

2. Description of the Related Art

Figure 15:
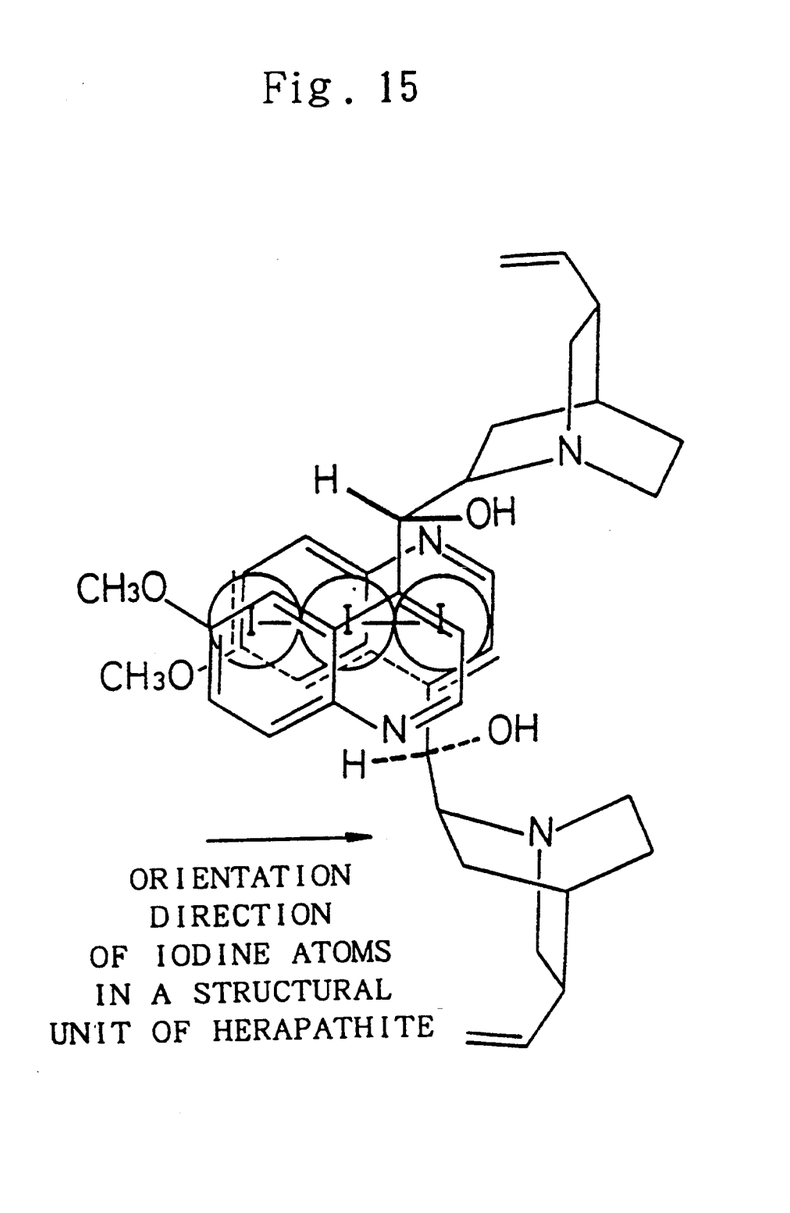
FIG. 15 illustrates a structural unit of herapathite.

A clathrate compound which includes quinine and iodine and which is shown in FIG. 15 is called a herapathite. The herapathite has been known that it is useful in optical applications because of its polarizability of light. In the crystal of the herapathite, the iodine atoms are oriented as illustrated in FIG. 15. Hence, there arises a dipole in the orientation direction.

When the herapathite is made into capillary crystals, it is possible to construct a particles dispersion type display device. Namely, the capillary herapathite crystals are floated in an appropriate organic dispersion medium, and the thus obtained suspension is filled into a panel which has electrodes therein. When an electric field of a predetermined direction is applied to the panel, the herapathite crystals which have been floating in the organic dispersion medium are aligned in a predetermined direction because of their dipoles. When the application of the electric field is stopped, the herapathite crystals are disoriented and are mixed each other at random in the organic dispersion medium. Hence, the herapathite can be employed in a light controlling device such as an optical valve or the like by utilizing its characteristics above mentioned.

As for a process for producing the capillary herapathite crystals, there is a process which is disclosed in Japanese Examined Patent Publication (KOKOKU) No. 20560/1973. As set forth in the publication, quinine or preferably quinine sulfate is dissolved into the aqueous solution of sulfuric acid and acetic acid in the presence of iron ions. Then, iodine and potassium iodide are added to the resulting solution to produced a clathrate compound. Thereafter, the thus precipitated crystals are filtered and dried to get the capillary herapathite crystals. The herapathite crystals obtained by this process have iodine atoms which are oriented in parallel with the minor axis of the crystals. This orientation of the iodine atoms result in a problem such as a slow responding speed when the herapathite crystals are applied to the light controlling device or the like.

Further, the herapathite crystals obtained by this process have the problems of the heat deterioration. For example, one may think of employing the above-mentioned herapathite crystals for an automobile windshield glass so that a driver can control the light transmittance of the windshield glass. For this purpose, it is necessary to fill the herapathite crystals into the laminated glass in the process of producing an automobile windshield glass. However, it has been known that the herapathite crystals obtained by the above-described conventional production process are decomposed or degraded at a temperature of 110° C. or more. Therefore, the herapathite crystals cannot be filled into the laminated glass which is processed to the automobile windshield glass at a high temperature of 130° C. or more.

SUMMARY OF THE INVENTION

The present invention has been developed in view of the above-mentioned circumstances. It is an object of the present invention to enhance the heat resistance of the herapathite crystal and to improve the orientation direction of the iodine atoms therein.

A first aspect of the present invention is a heat resistant herapathite which is developed in order to solve the above-mentioned problems. The heat resistant herapathite is obtained by reacting quinine, sulfuric acid, alkaline metal iodide and iodine, and it is expressed by a chemical formula, $xC_{20}H_{24}N_2O_2 \cdot yH_2SO_4 \cdot zHI_3$, wherein the ratio of a number of the sulfuric acid molecules (y) with respect to a number of the iodine atoms (3z), i.e., (y/3z), is less than 0.5, and the herapathite has a capillary crystal form in which the iodine atoms are oriented in a major axis direction of the capillary crystal form. Here, it is readily appreciated that "x" is a number of quinine molecules, "y" is a number of sulfuric acid molecules and "z" is a number of hydrogen triiodide ($HI_3$) fragments in the chemical formula.

A second aspect of the present invention is a process for producing the heat resistant herapathite. The process comprises the steps of:

a reaction step of reacting quinine, sulfuric acid, alkaline metal iodide and iodine in at least one of water, alcohol and acetic acid (a first solvent) to obtain herapathite crystals;

a first separating step of separating the herapathite crystals from the first solvent;

a recrystallizing step of supplying the herapathite crystals into a second solvent, heating them and cooling them to recrystallize the herapathite crystals, the second solvent comprising at least one of water and alcohol and having a weight ratio (R) of water with respect to alcohol which is more than 50/50 (i.e., R>50/50) or which is less than 10/90 (i.e., R<10/90); and a second separating step of separating the recrystallized herapathite crystals from the second solvent.

In the reaction step of the second aspect of the present invention, the same herapathite crystals as those obtained by a conventional method are produced. For instance, quinine, sulfuric acid, alkaline metal iodide and iodine are mixed in a stoichiometric ratio in the first solvent, and they are reacted to obtain the herapathite crystals. As for the first solvent, it is possible to use a conventional solvent such as water, alcohol and acetic acid. The reaction can be carried out as follows. Namely, quinine is dissolved into water, alcohol, sulfuric acid and acetic acid, and then iodine and potassium iodide are added to and stirred with the resulting solution at room temperature to obtain the herapathite crystals.

The separation of the first separating step is carried out in order to separate the herapathite crystals produced by the reaction from the first solvent which still contains unreacted components. When the unreacted components are present in the recrystallizing step, the aiming herapathite crystals cannot be obtained, and the heat resistance of the finally produced herapathite crystals decreases. The separation can be carried out with ease by filtering the herapathite crystals with a filter paper.

In the second aspect of the present invention, the recrystallizing step is carried out as follows. The herapathite crystals are supplied into the second solvent which comprises at least one of water and alcohol, and the resulting mixture is cooled to recrystallize the herapathite crystals after heating it. This recrystallizing step varies the crystal structure of the herapathite crystals. In other words, the herapathite crystals undergo a phase transition, and they change into the present herapathite crystals superior in the heat resistance.

In the recrystallizing step, it is important to use a second solvent with a predetermined mixing ratio of water and alcohol. Namely, it is necessary that the weight ratio (R) of water with respect to alcohol (a weight of water/a weight of alcohol) is more than 50/50 (i.e., R>50/50) or the weight ratio (R) is less 10/90 (i.e., R<10/90). When the weight ratio (R) deviates from either of these ranges, the heat resistance of the finally produced herapathite crystals decreases. It is preferred that the weight ratio (R) is 70/50 or more (i.e., $R \geq 270/30$).

In addition, when a second solvent which has the weight ratio (R) of less than 10/90 (i.e., R<10/90) is used, it is possible to obtain the herapathite crystals which are finer than the herapathite crystals obtained by using the second solvent which has the weight ratio (R) of more than 50/50.

Finally, the heat resistant herapathite according to the present invention is separated in the second separating step after the recrystallizing step. The separation of the second separating step can be carried out similarly to that of the first separating step.

Figure 1:
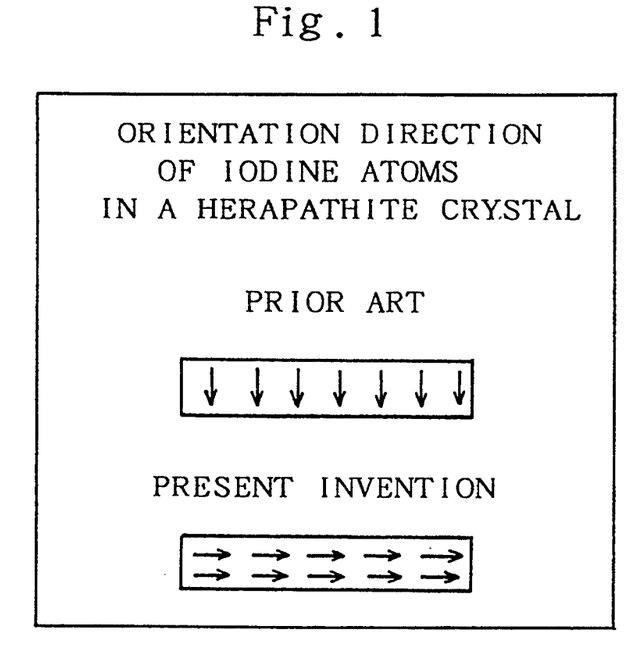
FIG. 1 is a schematic illustration which shows orientations of iodine atoms in a herapathite according to the present invention and a conventional herapathite.

The inventors of the present invention analyzed the conventional herapathite crystals obtained by the process which is disclosed in Japanese Examined Patent Publication (KOKOKU) No. 20560/1973 by elementary analysis. According to the results of the analysis, the conventional herapathite crystals had a planar crystal form, and they had a composition ratio off x:y:z=4:3:2 in the chemical formula, $xC_{20}H_{24}N_2O_2 \cdot yH_2SO_4 \cdot zHI_3$. Further, the iodine atoms of the conventional herapathite crystals were found by using a polarization microscope to be oriented in parallel with a minor axis of the crystals, as illustrated in FIG. 1.

The inventors of the present invention also analyzed the heat resistant herapathite according to the first aspect of the present invention by the X-ray diffraction analysis. According to the results of the analysis, the present herapathite crystals were found to have a composition ratio which differed from that of the conventional herapathite crystals, and they had a novel crystal form. Namely, the present heat resistant herapathite crystals have a capillary crystal form, and they have a composition ratio of x:y:z=7:4:4 or 8:5:4 in the chemical formula, $xC_{20}H_{24}N_2O_2 \cdot yH_2SO_4 \cdot zHI_3$. In particular, the present heat resistant herapathite crystals are adapted to have the composition ratio in which the number of sulfuric acid molecules are slightly less than the conventional herapathite crystals having the composition ratio of x:y:z =4:3:2. Moreover, the iodine atoms of the present heat resistant herapathite are oriented in parallel with a major axis of the crystals. Hence, the present heat resistant herapathite is novel and superior in its heat resistance.

According to the research and development conducted by the present inventors, the crystal structure of the herapathite is found to exist in various forms, and the crystal structures and the properties associating therewith are revealed. In particular, the conventional herapathite which has the composition ratio of x:y:z=4:3:2 in the chemical formula, $xC_{20}H_{24}N_2O_2 \cdot yH_2SO_4 \cdot zHI_3$ are inferior in its heat resistance, and its iodine atoms are oriented in parallel with a minor axis of the crystals.

On the other hand, the heat resistant herapathite according to the first aspect of the present invention is adapted to have the composition ratio in which the number of sulfuric acid molecules are slightly less than that of the conventional herapathite. Hence, the heat resistance of the present herapathite is improved. Further, the present heat resistant herapathite has a capillary crystal form in which its iodine atoms are oriented in parallel with a major axis of the crystals. This is why most of the present herapathite molecules are aligned so that their major axes are oriented in a voltage application direction when the present herapathite are filled into a cell together with a dispersion medium and when the voltage is applied to the cell. Hence, the present herapathite gives a superior transparency when a voltage is applied. In addition, since the present herapathite has an capillary form, it responds quickly to the turning on and off the voltage application, and the contrast of the light shielding glass is improved sharply.

In the second aspect of the present invention, the herapathite crystals are precipitated in the reaction step. The precipitated herapathite crystals are still the conventional ones which are inferior in the heat resistance and in which the iodine atoms are oriented at random.

Then, the herapathite crystals are separated in the first separating step. Without this separation, the present herapathite crystals cannot be obtained even if the recrystallization is done with the solvent of the present invention. It is believed that this phenomenon is caused by the unreacted substances and acids which are contained in the first solvent.

In the next recrystallizing step, the separated herapathite crystals are heated in the second solvent which comprises at least one of water and alcohol, and are cooled to recrystallize the present heat resistant herapathite crystals. In the recrystallizing step, it is possible to vary the composition of the second solvent to recrystallize the present herapathite crystals. In other words, when the weight ratio (R) of water with respect to alcohol is R>50/50 or R<10/90 the present herapathite crystals generate. In particular, when the weight ratio (R) is $R \geq 70/30$, it is possible to generate only the present herapathite crystals which have the composition ratio of x:y:z=7:4:4 in the chemical formula and an capillary form and which are superior in their heat resistances.

Consequently, the second aspect of the present invention produces the heat resistant herapathite in a good yield.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Having generally described the present invention, a further understanding can be obtained in reference to the specific preferred embodiments which are provided herein for the purpose of illustration only and are not intended to limit the scope of the appended claims.

FIRST PREFERRED EMBODIMENT

Reaction Step 2.5 grams of quinine were dissolved into 30 grams of distilled water, 30 grams of ethanol, 15 grams of acetic acid and 0.567 grams of concentrated sulfuric acid (first solvent) Then, both 0.98 grams of iodine and 0.64 grams of potassium iodide dissolved into the mixtures of 20 grams of distilled water and 5 grams of ethanol were added to it. The obtained solution was stirred to react at room temperature for 1 hour. Thus, herapathite crystals were precipitated.

First Separation Step

Thereafter, the resultant solution was filtered with a filter paper ("PF050" made by Toyo Roshi Co., Ltd. ), and it was washed with distilled water to separate the herapathite crystals. Thus, 4.2 grams of the herapathite crystals were obtained.

Recrystallization Step

Approximately 2% by weight of the herapathite crystals obtained by the proceeding steps were added to a mixed solvent (a second solvent) of distilled water and ethanol whose weight ratio (R) of distilled water/ethanol was 90/10. The solution was heated to 80° to 90° C., and it was cooled to room temperature gradually. The solution was turned into a gel-like product at room temperature.

Second Separation Step

The obtained product was filtered in a manner similar to the First Separation Step, and the filtered cake was air-dried to obtain the heat resistant herapathite crystals of the First Preferred Embodiment according to the present invention (hereinafter referred to as "Sample No. 1"). According to the observation with a microscope, thus obtained herapathite crystals had a capillary form whose width was from 0.05 to 0.1 micrometer approximately and whose length was from 1 to 5 micrometers approximately. According to the observation with a polarization microscope, the obtained herapathite crystals had the iodine atoms which were oriented in parallel with a major axis of the crystals.

Elementary analysis was done twice for these herapathite crystals to determine the composition of these herapathite crystals. The results of the measurements are set forth in Table 1.

COMPARATIVE EXAMPLE 1

Herapathite crystals of Comparative Example 1 were prepared similarly to those of the First Preferred Embodiment other than that the herapathite crystals obtained by the first separation step were added to a mixed solvent whose weight ratio (R) of distilled water/ethanol was 50/50 in the recrystallization step. Elementary analysis was also done for the obtained herapathite crystals (hereinafter referred to as "Sample No. R1"). The results of the measurements are also set forth in Table 1.

TABLE 1

| Element | | C | H | N | O | S |
|---|---|---|---|---|---|---|
| Sample | 1st Run | 38.14 | 4.08 | 4.42 | 12.32 | 3.93 |
| No. 1 | 2nd Run | 38.21 | 4.13 | 4.33 | 12.35 | 3.99 |
| Sample | 1st Run | 35.88 | 3.84 | 4.50 | 9.76 | 2.85 |
| No. R1 | 2nd Run | 35.65 | 3.80 | 4.00 | 9.74 | 2.75 |

(unit % by weight)

When numeric values in Table 1 are divided by the atomic weights of the elements and when the divided numeric values are converted to ratios of integers, it is readily appreciated that the Sample No. 1 has the composition ratio of $x:y:z=7:4:4$ in the chemical formula, $xC_{20}H_{24}N_2O_2 \cdot yH_2SO_4 \cdot zHI_3$, and that the Sample No. R1 has the composition ratio of $x:y:z=4:3:2$ in the chemical formula.

First Applicability Evaluation

Figure 2:
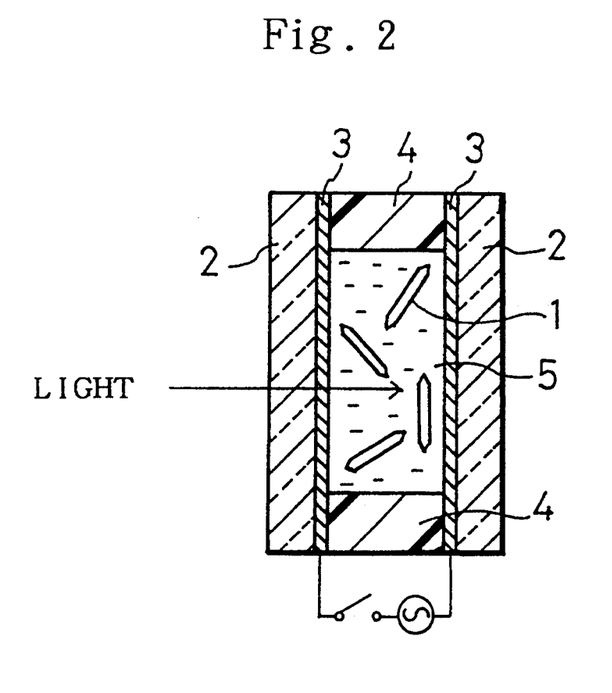
FIG. 2 is a cross sectional view of an evaluation cell employed for evaluating a herapathite of a First Preferred Embodiment, and it illustrates the evaluation cell not biased.

An evaluation cell was prepared by using the heat resistant herapathite (Sample No. 1), as illustrated in FIG. 2, and the light shielding performance of the evaluation cell was examined. The evaluation cell included a pair of glass substrates 2 (made of soda-lime glass having a thickness of 1.1 mm) which were disposed in parallel, a pair of ITO (indium-tin oxide) transparent electrodes 3 which were formed respectively on the opposing surface of each glass substrate 2 in a thickness of 1500 Å, and an epoxy adhesive which sealed circumferential portions of the pair of glass substrates 2. A dispersion medium 5 and the present herapathites 1 were filled into a 100-micrometer-thickness cell gap which was surrounded by the pair of glass substrates 2 and the spacer 4. The dispersion medium 5 was ditridecyl phthalate. In addition to ditridecyl phthalate, dinonyl phthalate, dioctyl phthalate, dihexyl phthalate, diamyl phthalate, isophthalate ester, terephthalate ester, silicon oil or the like can be used as the dispersion medium 5 virtually similarly. The present herapathites 1 were dispersed in the dispersion medium 5 in an amount of 1% by weight.

Figure 3:
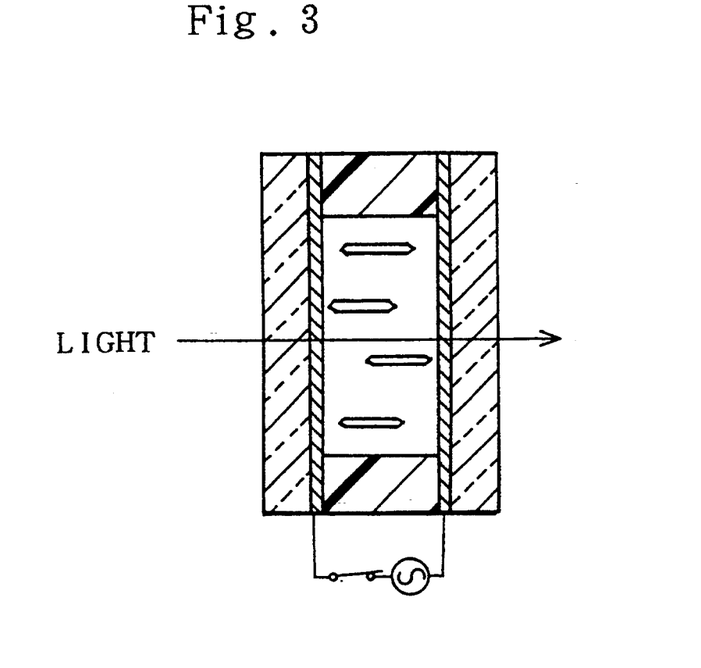
FIG. 3 illustrates another cross sectional view of the evaluation cell where some voltage is applied.
Figure 4:
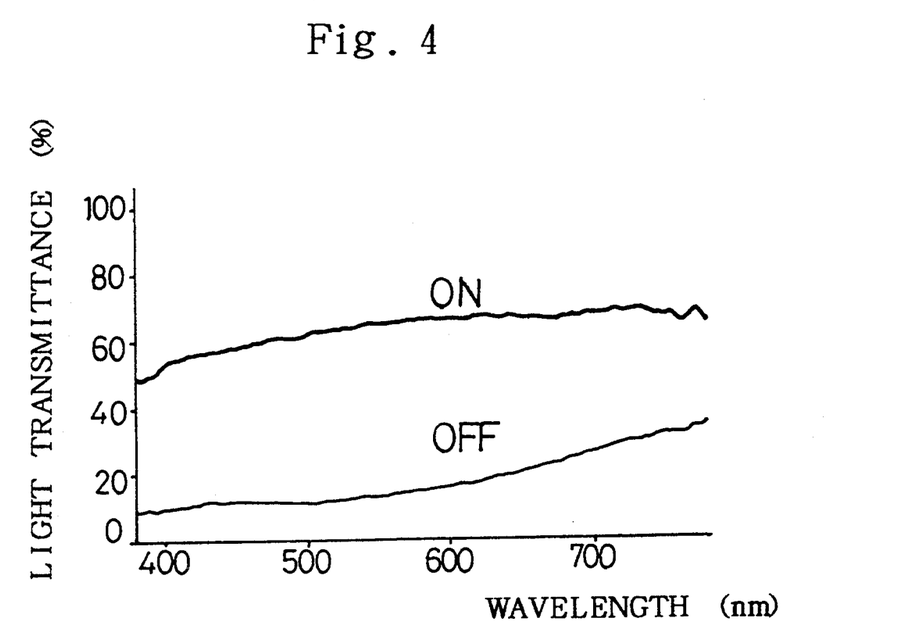
FIG. 4 is a graph which shows relationships between wavelengths and light transmittances exhibited by the evaluation cell.

The evaluation cell was biased by a 50V–60Hz alternating voltage with a rectangular wave to measure its light transmittances. FIG. 2 illustrates the evaluation cell not biased, and FIG. 3 illustrates the evaluation cell when the voltage is applied. FIG. 4 shows relationships between wavelengths and light transmittances of the evaluation cell. It is readily understood from FIG. 4 that the evaluation cell exhibited excellent light transmittances when the voltage was applied, and that excellent shielding for all wavelength range of light without a voltage application. This means that the evaluation cell gave a favorable contrast. Further, the evaluation cell responded at a speed of 1 second or less to the on and off of the voltage.

Similarly, an extra evaluation cell was prepared by using the herapathite of the Comparative Example 1 (Sample No. R1), and it was also subjected to the switching test. However, it was found that this evaluation cell responded so slowly when the voltage is turned off that it took a few hours to recover its obscure optical state.

Second Applicability Evaluation

Figure 5:
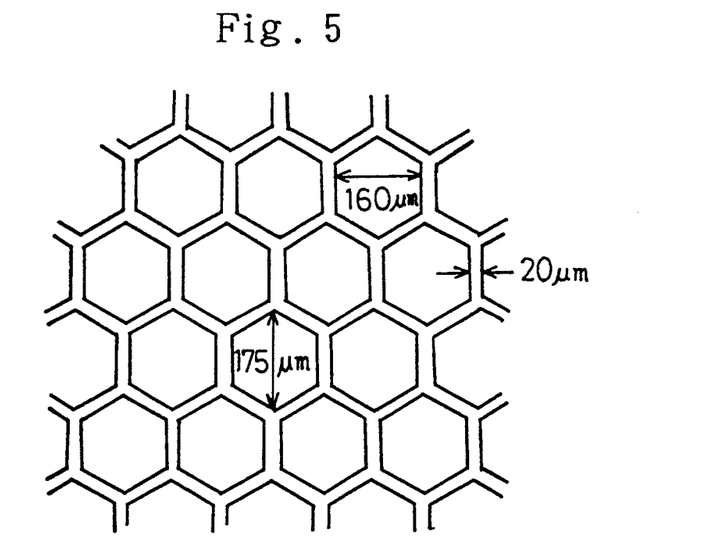
FIG. 5 is a schematic illustration which shows a pattern of a mesh film employed for evaluating the herapathite of the First Preferred Embodiment.
Figure 6:
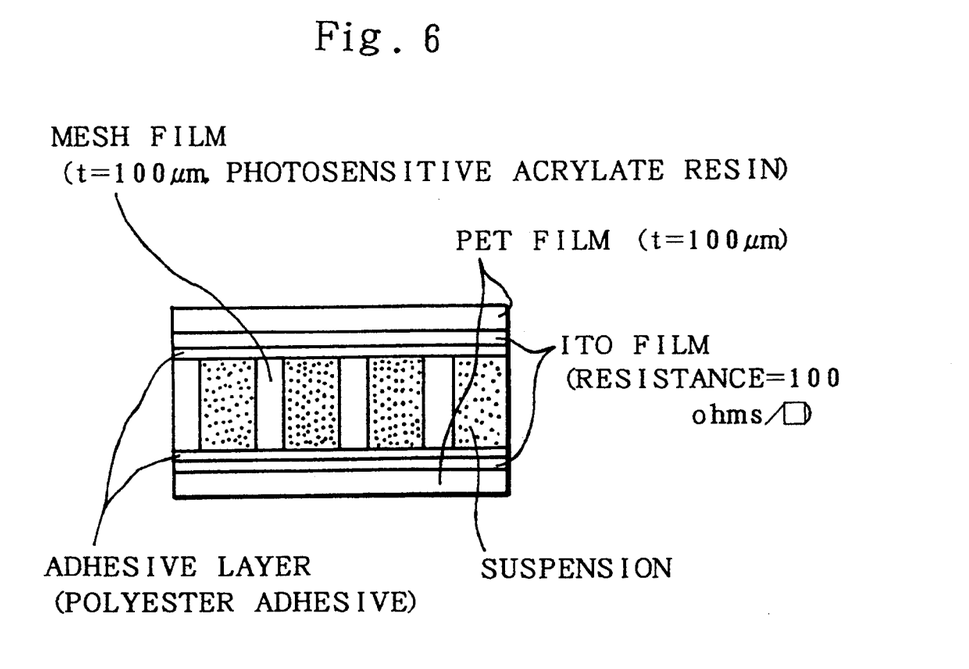
FIG. 6 is a cross sectional view of an evaluation cell employed for evaluating the herapathite of the First Preferred Embodiment.
Figure 7:
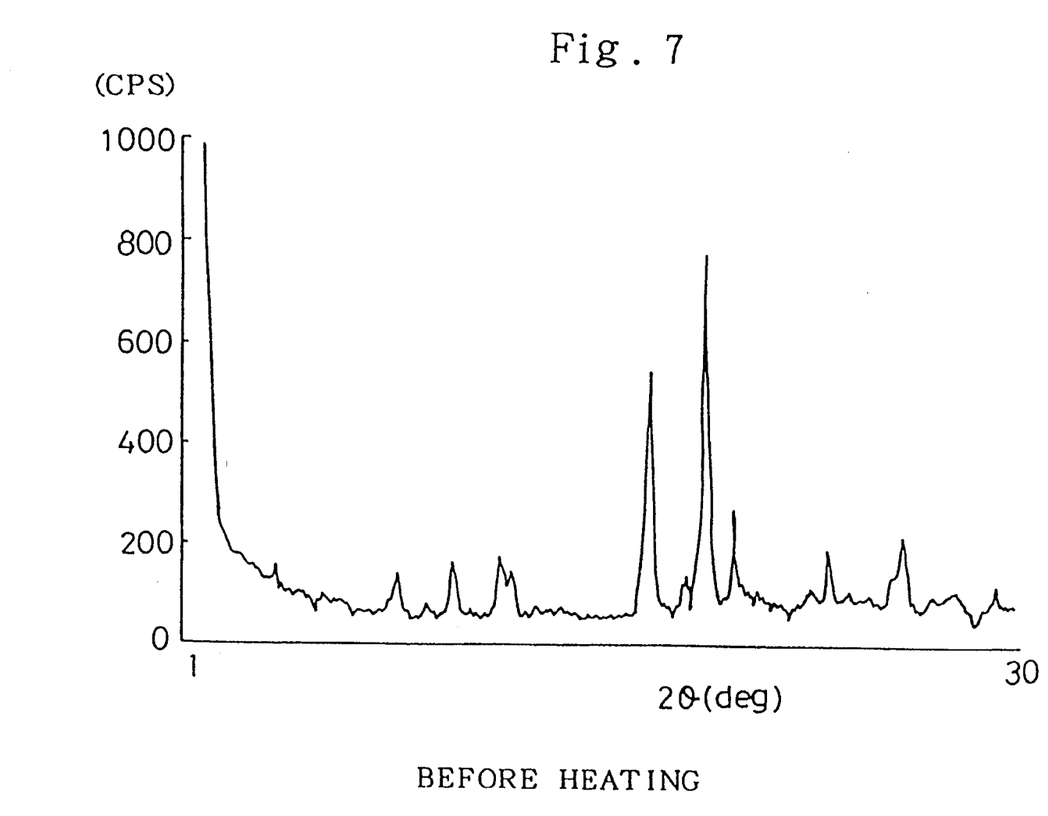
FIG. 7 is an X-ray diffraction chart of the herapathite of the First Preferred Embodiment before a heat resistance test.
Figure 8:
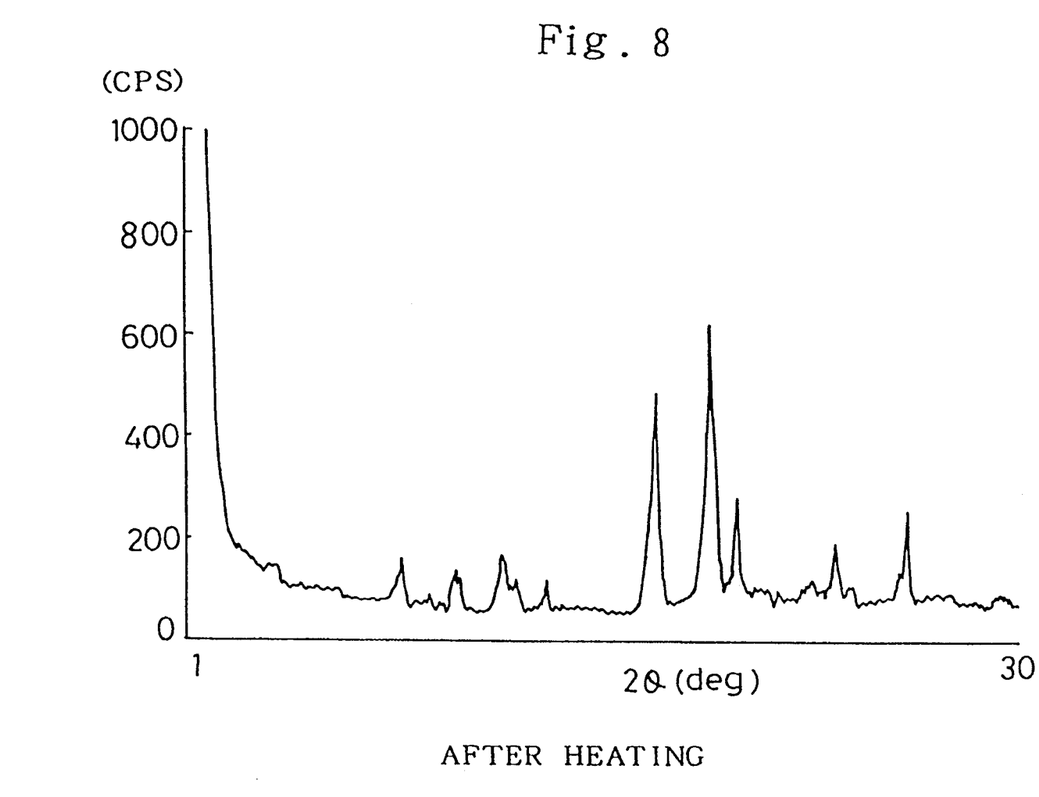
FIG. 8 is an X-ray diffraction chart of the herapathite of the First Preferred Embodiment after the heat resistance test.
Figure 9:
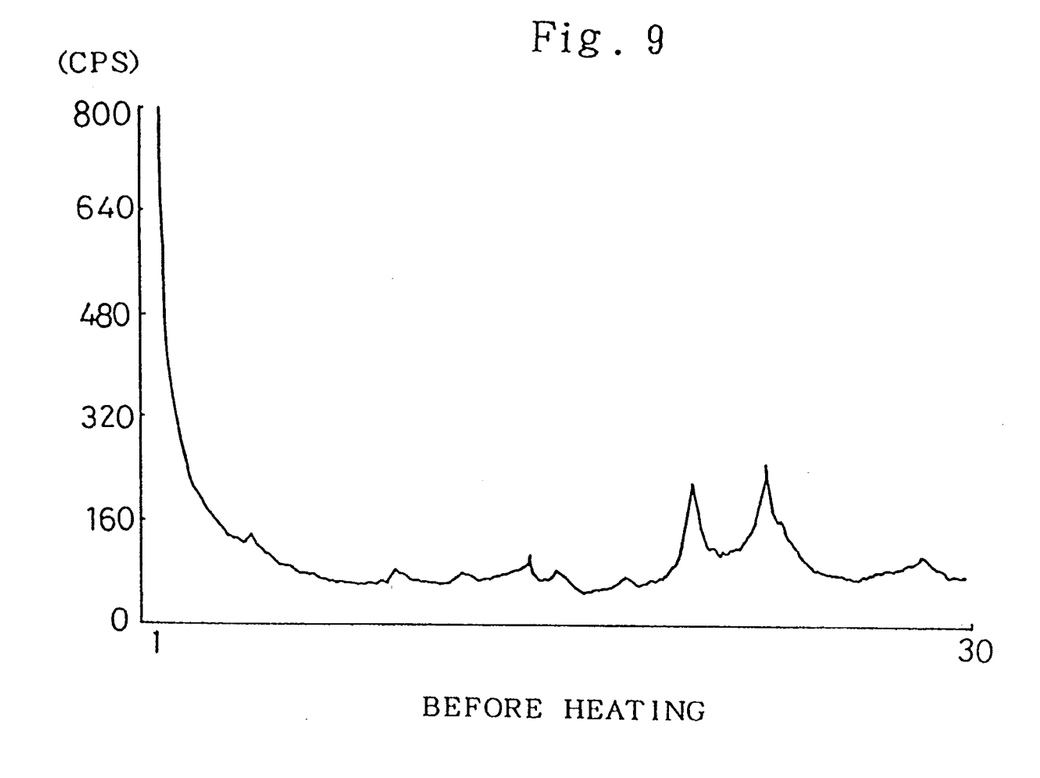
FIG. 9 is an X-ray diffraction chart of the herapathite of the Second Preferred Embodiment before the heat resistance test.
Figure 10:
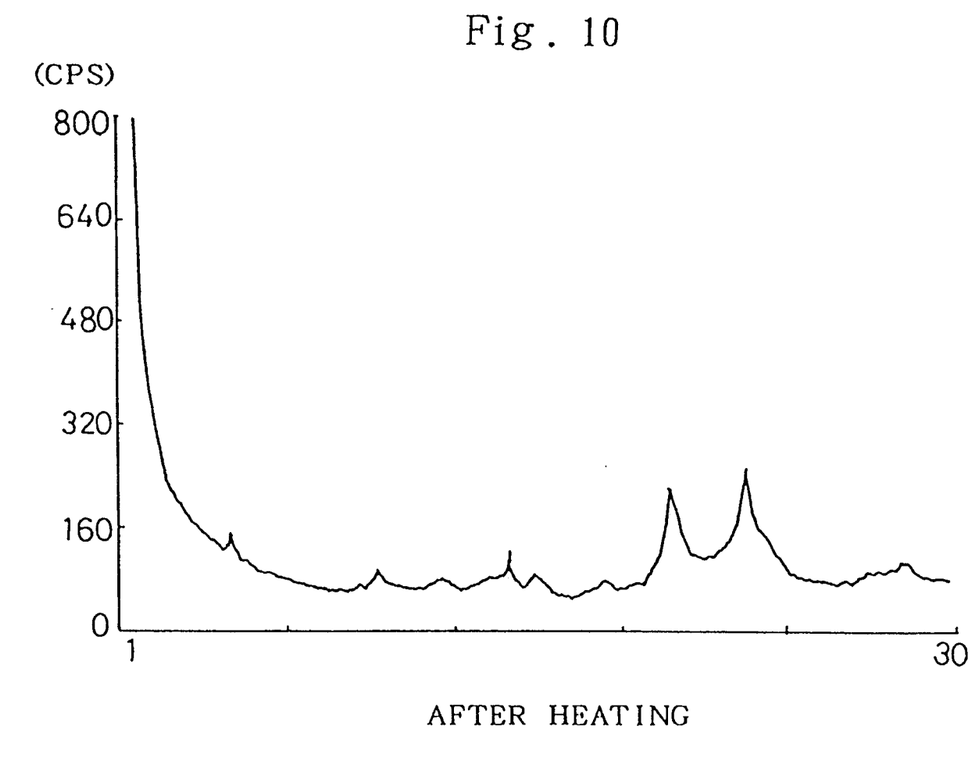
FIG. 10 is an X-ray diffraction chart of the herapathite of the Second Preferred Embodiment after the heat resistance test.
Figure 11:
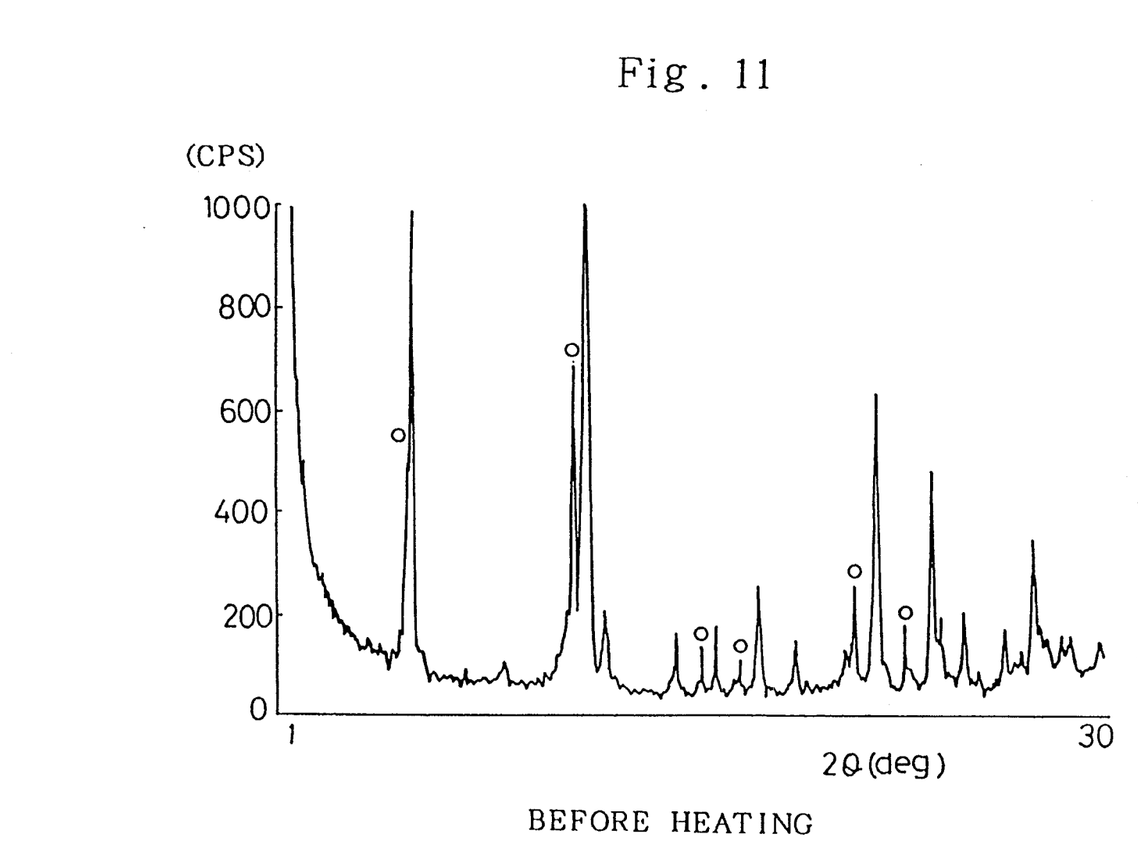
FIG. 11 is an X-ray diffraction chart of the herapathite of the Comparative Example 2 before the heat resistance test.
Figure 12:
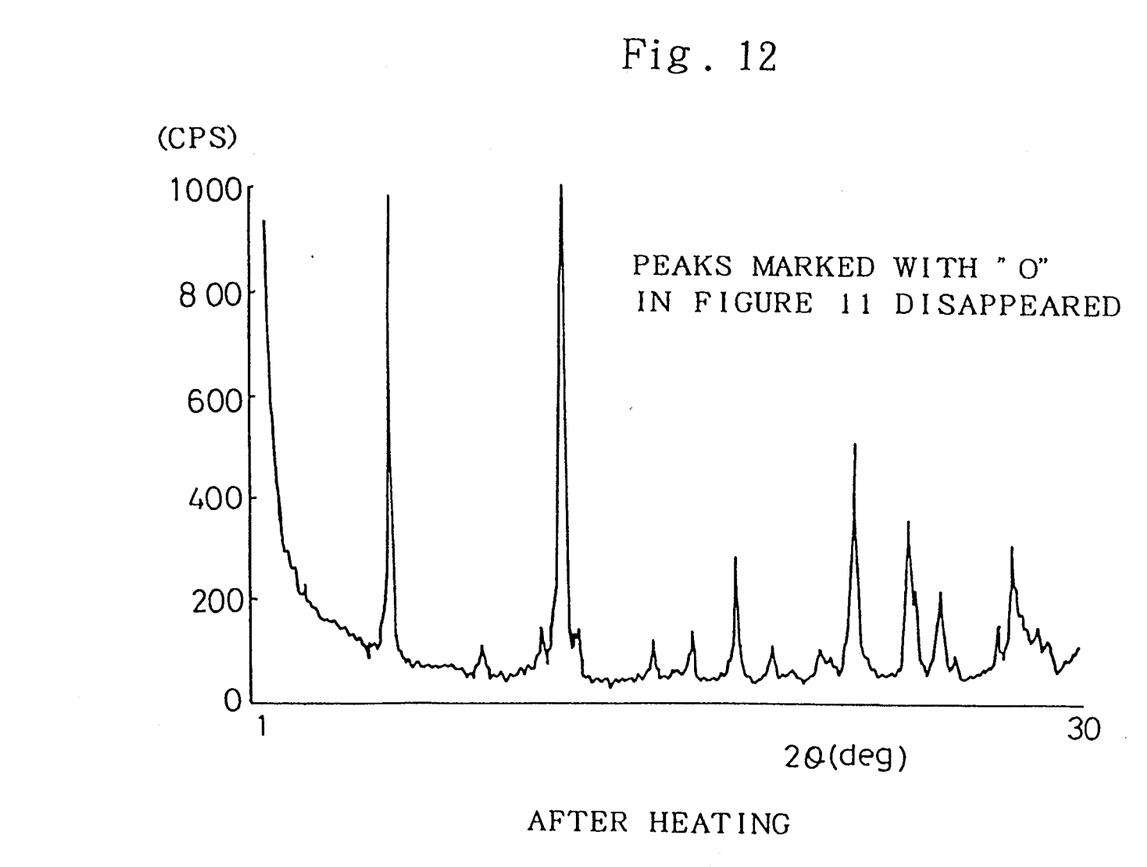
FIG. 12 is an X-ray diffraction chart of the herapathite of the Comparative Example 2 after the heat resistance test.
Figure 13:
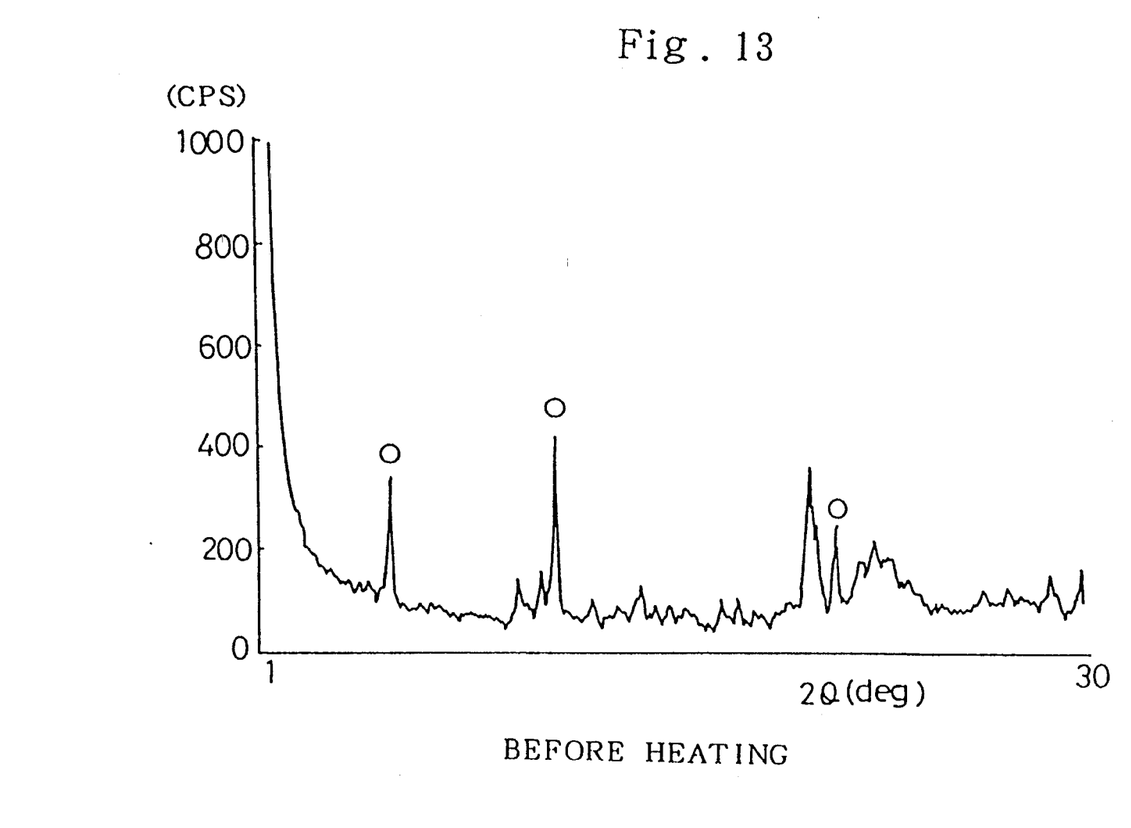
FIG. 13 is an X-ray diffraction chart of the herapathite of the Comparative Example 3 before the heat resistance test.
Figure 14:
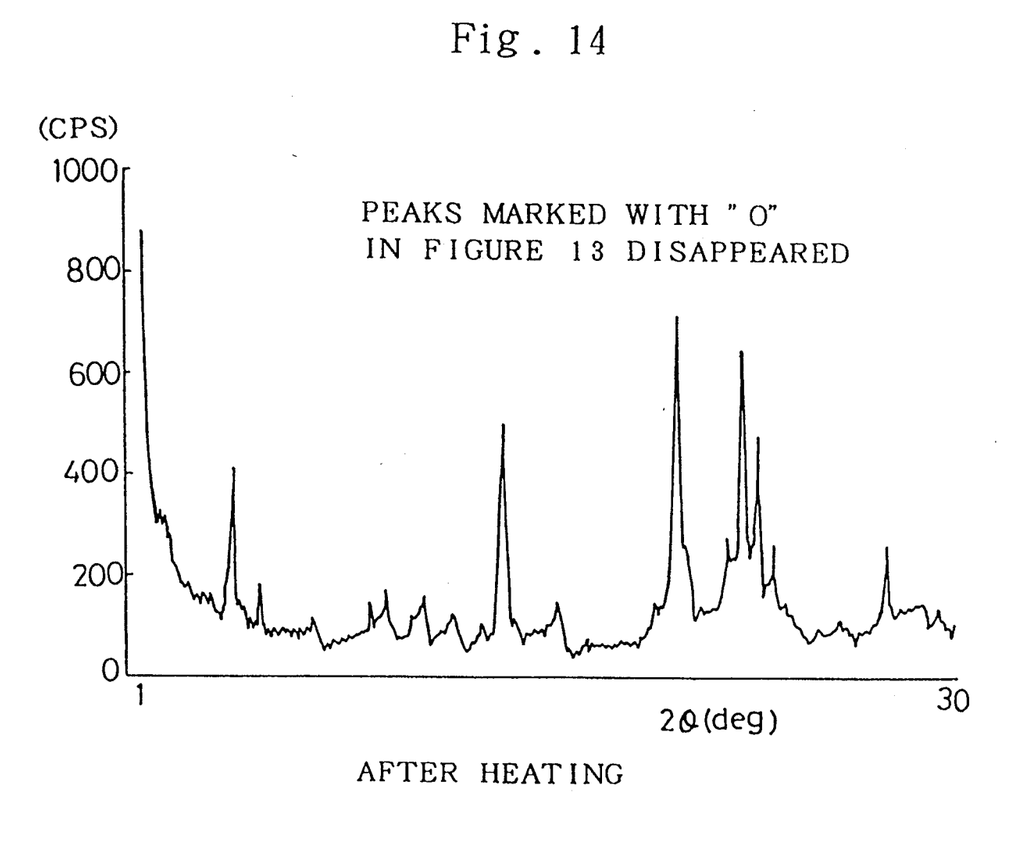
FIG. 14 is an X-ray diffraction chart of the herapathite of the Comparative Example 3 after the heat resistance test.

Similar favorable results were obtained by examining another evaluation cell which will be hereinafter described. Namely, the present herapathites were dispersed in phthalate ester to form a suspension. This suspension was filled into a patterned cell (i.e., a mesh film, as illustrated in FIG. 5). The mesh film was formed of a photosensitive acrylate resin disposed on a film which composed of a PET (polyethylene terephthalate) substrate and an ITO film disposed on the PET substrate. Further, another film which composed of a PET substrate and an ITO film disposed on the PET substrate was disposed on the mesh film so as to hold the suspension containing the present herapathites therebetween. Thus, a light controlling film was prepared, as illustrated in FIG. 6. The mesh pattern is not limited to the hexagonal pattern as illustrated in FIG. 5, but it can be a square pattern, a rectangular pattern or the like.

In this evaluation cell, the mesh film works to divide the suspension into a lot of vacuole-like cells. This is why the suspension leakage can be suppressed as less as possible when this light controlling film breaks. Further, the mesh film works as a spacer when preparing this light controlling film. Hence, a light controlling film can be prepared which has a uniform cell gap and which is free from blurring.

SECOND PREFERRED EMBODIMENT

Recrystallization Step

The preparation of the herapathite of the Second Preferred Embodiment according to the present invention was carried out in the same manner as that of the First Preferred Embodiment up to the First Separation Step. Approximately 0.5% by weight of thus obtained herapathite crystals were added to pure ethanol. The obtained solution was stirred with an ultrasonic washer for 5 minutes. When the solution was taken out, a brown gel-like product was observed.

Second Separation Step

After centrifuging the gel-like product, it was air-dried to obtain the heat resistant herapathite crystals of the Second Preferred Embodiment (hereinafter referred to as "Sample No. 2"). According to the observation with a microscope, the thus obtained herapathite crystals had an capillary crystal form whose width was from 0.01 to 0.1 micrometer approximately and whose length was 1 micrometer approximately at a maximum. These dimensions tell that the herapathite crystals of the Second Preferred Embodiment formed capillary crystals which were finer than that of the First Preferred Embodiment. According to the observation with a polarization microscope, the herapathite crystals were found to have the iodine atoms which were oriented in parallel with a major axis of the crystals. The results of the elementary analysis are set forth in Table 2. It is readily found from Table 2 that the Sample No. 2 has the composition ratio of $x:y:z = 8:5:4$ in the chemical formula.

TABLE 2

| Element | | C | H | N | O | S |
|---|---|---|---|---|---|---|
| Sample | 1st Run | 38.94 | 4.22 | 4.47 | 18.27 | 3.20 |
| No. 2 | 2nd Run | 38.98 | 4.33 | 4.42 | 18.15 | 3.22 |

(unit: % by weight)

Herapathite crystals of Comparative Example 2 were prepared similarly to those of the First Preferred Embodiment other than that the herapathite crystals obtained by the first separation step were added to a mixed solvent whose weight ratio (R) of distilled water/ethanol was 30/70 in the recrystallization step.

Comparative Example 3

Herapathite crystals of Comparative Example 3 were prepared similarly to those of the First Preferred Embodiment other than that the herapathite crystals obtained by the first separation step were added to a mixed solvent whose weight ratio (R) of distilled water/ethanol was 10/90 in the recrystallization step.

X-ray Diffraction Evaluation

The herapathite crystals of the First and Second Preferred Embodiments and the herapathite crystals of the Comparative Examples 2 and 3 were heated in an oven at 130° C. for 1 hour, and their X-ray diffraction charts before and after the heating were compared. As a result, it was found that the herapathite crystals obtained in the First and Second Preferred Embodiments did not show any change in their X-ray diffraction pattern after the heating, as can be seen from FIGS. 7, 8, 9 and 10. However, it was found that the herapathite crystals obtained in the Comparative Examples 2 and 3 lost some peaks (marked with "o") in their before-the-heating X-ray diffraction patterns after the heating, as can be seen from FIGS. 11, 12, 13 and 14. This fact implies that some parts of their crystal structures were destroyed.

COMPARATIVE EXAMPLE 4

Moreover, herapathite crystals of a Comparative Example 4 were prepared as set forth in Japanese Examined Patent Publication (KOKOKU) No. 20560/1973. Namely, 1 gram of quinine sulfate was dissolved into 80 milliliters of water, 3 milliliters of glacial acetic acid and 5 milliliters of 6 N sulfuric acid. Then, iron chloride was added to the obtained solution so as to contain the iron component in an amount of 800 milligrams, and this solution was cooled to 0° C. approximately. Thereafter, 0.35 grams of iodine and 0.15 grams of potassium iodide was added to 2.5 milliliters of the cooled solution while applying ultrasonic to the solution. Thus, fine herapathite crystals were precipitated. The obtained herapathite crystals were filtered and washed. Finally, the cake was dried to obtain herapathite crystals in capillary and planar forms. These herapathite crystals were subjected to the heating and were evaluated by X-ray diffraction analysis. It was also found that these herapathite crystals did show the same changes in their X-ray diffraction charts after the heating as the Comparative Examples 2 and 3 did.

The results of this X-ray diffraction evaluation show that the herapathite crystals of the First and Second Preferred Embodiments are superior in their heat resistances to the comparative herapathite crystals and the prior art herapathite crystal. The crystals of the preferred embodiments can be put into a practical use such as a light-shielding laminated glass and so on. In addition, the heat resistant herapathite crystals can be produced easily and stably by the production process as described in the First and Second Preferred Embodiments.

Having now fully described the present invention, it will be apparent to one of ordinary skill in the art that many changes and modifications can be made thereto without departing from the spirit or scope of the present invention as set forth herein including the appended claims.

What is claimed is:

1. A heat resistant herapathite comprising quinine, sulfuric acid and iodide, said herapathite being in a form of a capillary crystal in which atoms of said iodine are oriented in parallel with a major axis of said capillary crystal wherein said herapathite has a chemical formula, $xC_{20}H_{24}N_2O_2 \cdot yH_2SO_4 \cdot zHI_3$, in which "x" is a number of guinine molecules, y is a number of sulfuric acid molecules and "z" is a number of hydrogen triiodide ($HI_3$) fragments, and a ratio of said "y" with respect to a number of iodine atoms "3z", i.e., (y/3z), is 0.42 or less.

2. A heat resistant herapathite according to claim 1, wherein said herapathite has heat resistance to a temperature of 130° C. or more.

3. A heat resistant herapathite according to claim 1, wherein a composition ratio of x:y:z in said chemical formula is 7:4:4.

4. A heat resistant herapathite according to claim 1, wherein a composition ratio of x:y:z in said chemical formula is 8:5:4.

5. A heat resistant herapathite according to claim 1, wherein said capillary crystal has a width of 0.01 to 0.1 micrometer and a length of not more than 5 micrometers.

6. The heat resistant herapathite according to claim 1, wherein a crystal major axis of said heat resistant herapathite is oriented in a dispersion medium in parallel with a direction of an electric field application.

7. A heat resistant herapathite comprising guinine, sulfuric acid and iodide, said herapathite being in the form of a capillary crystal in which atoms of iodine are oriented in parallel with a major axis of said capillary crystal, said heat resistant herapathite having been produced by a process comprising the steps of:
reacting quinine, sulfuric acid, alkaline metal iodide and iodine in a first solvent composed of at least one of water, alcohol and acetic acid to obtain herapathite crystals;
separating said herapathite crystals from said first solvent;
adding said separated herapathite crystals to a second solvent, heating and cooling the same to recrystallize said herapathite crystals, said second solvent comprising at least one of water and alcohol with a mixing weight ratio (R) of water with respect to alcohol being more than 50/50; and
separating recrystallized herapathite crystals from said second solvent, said recrystallized herapathite crystals being in the form of a capillary crystal in which atoms of iodine are oriented in parallel with a major axis of said capillary crystal.

8. A light controlling device, comprising:
two substrates disposed opposedly;
at least a pair of electrodes disposed on an opposing surface of each of said substrates;
a partition member comprising a mesh film disposed between said electrodes for dividing a space which is formed between said substrates into a plurality of cells; and
a suspension containing said heat resistant herapathite set forth in claim 1 and filled in said divided cells.

9. A light controlling device according to claim 8, wherein said space has a width of of 100 micrometers or less, and said cells have a width of 1 mm or less.

10. A light controlling device according to claim 8, wherein said partition member is made of a photosensitive acrylate resin.

11. A light controlling device according to claim 8, wherein said suspension further contains at least one of silicon oil and phthalate esters as a dispersion medium.

12. A process for producing a heat resistant herapathite, comprising the steps of:
reacting quinine, sulfuric acid, alkaline metal iodide and iodine in a first solvent composed of at least one of water, alcohol and acetic acid to obtain herapathite crystals;
separating said herapathite crystals from said first solvent;
adding said herapathite crystals to a second solvent, heating and cooling the same to recrystallize said herapathite crystals, said second solvent comprising at least one of water and alcohol with a mixing weight ratio (R) of water with respect to alcohol being more than 50/50; and
separating recrystallized herapathite crystals from said second solvent.

13. A process for producing a heat resistant herapathite according to claim 12, wherein said mixing weight ratio (R) of water with respect to alcohol in said second solvent is 70/50 or more.

14. A process for producing a heat resistant herapathite, comprising the steps of:
reacting quinine, sulfuric acid, alkaline metal iodide and iodine in a first solvent composed of at least one of water, alcohol and acetic acid to obtain herapathite crystals;
separating said herapathite crystals from said first solvent;
adding said herapathite crystals to a second solvent, heating and cooling the same to recrystallize said herapathite crystals, said second solvent comprising at least one of water and alcohol with a mixing weight ratio (R) of water with respect to alcohol being less than 10/90; and
separating recrystallized herapathite crystals from said second solvent.

15. A process for producing a heat resistant herapathite according to claim 14, wherein said second solvent consists essentially of pure alcohol.

* * * * *

UNITED STATES PATENT AND TRADEMARK OFFICE
CERTIFICATE OF CORRECTION

PATENT NO. : 5,368,780
DATED : November 29, 1994
INVENTOR(S) : Tojima et al.

It is certified that error appears in the above-indentified patent and that said Letters Patent is hereby corrected as shown below:

Claim 1, Col. 9, line 38, change "guinine" to --quinine--;
        Col. 9, line 41, change "(v/3z)" to --(y/3z)--;

Claim 7, Col. 9, line 59, change "guinine" to --quinine--;

Claim 13, Col. 10, line 49, change "70/50" to --70/30--.

Signed and Sealed this

Twenty-eight Day of March, 1995

Attest:

BRUCE LEHMAN

Attesting Officer

Commissioner of Patents and Trademarks